Dec. 21, 1965 H. F. WOLF 3,225,261

HIGH FREQUENCY POWER TRANSISTOR

Filed Nov. 19, 1963

3 Sheets-Sheet 1

HELMUT F. WOLF

*INVENTOR.*

BY Roger S. Borovoy

ATTORNEY

Dec. 21, 1965 H. F. WOLF 3,225,261

HIGH FREQUENCY POWER TRANSISTOR

Filed Nov. 19, 1963 3 Sheets-Sheet 2

HELMUT F. WOLF
INVENTOR.

BY Roger S. Borovoy
ATTORNEY

HELMUT F. WOLF
INVENTOR.
BY Roger S. Borovoy
ATTORNEY 3,225,261

HIGH FREQUENCY POWER TRANSISTOR

Helmut F. Wolf, San Mateo, Calif., assignor to Fairchild Camera and Instrument Corporation, Long Island, N.Y., a corporation of Delaware Filed Nov. 19, 1963, Ser. No. 324,806
7 Claims. (Cl. 317—101)

This invention relates to a planar power transistor capable of readily dissipating heat generated by current passing therethrough. More specifically, the invention consists in a power transistor having its emitter and base split into a plurality of subregions, thereby greatly enhancing the ability of the device to dissipate heat within these regions.

It is well known in the art that most parameters relating to the ability of a transistor to operate at high frequencies change with temperature. For example, output power, power gain, characteristic frequency, and so on, all decrease appreciably as the operating temperature of the device increases. As a consequence, a device configuration which minimizes the operating temperature of a transistor will have an appreciable effect on these operating parameters. The planar power transistor of this invention is such a device. Thus it provides a high output power, a large power gain, and a high characteristic frequency.

Briefly, the planar power transistor of this invention, which is capable of readily dissipating heat generated by current passing therethrough, comprises the following: a wafer of monocrystalline semiconductor material having a flat surface and having; a collector region of one conductivity type, a plurality of base subregions of the opposite conductivity type from the collector region, formed within the collector region and extending to the flat surface, each of the base subregions being separated laterally from the others by a distance at least equal to the thickness of the wafer, a plurality of emitter subregions of the one conductivity type, each formed within a different one of the base subregions and extending to the flat surface; means for ohmically collectively connecting the base subregions; and means for ohmically collectively connecting the emitter subregions. This splitting of the emitter and base areas into subregions appreciably reduces the thermal coupling between subregions.

In the past, the heat dissipation has been improved by increasing the area of the base region. This increased the active area of the transistor, which in turn provided additional area for heat dissipation. However, such an oversized active area also appreciably increased the collector capacitance of the device. Therefore, a large portion of the high frequency advantage obtained by better heat dissipation was lost due to increased collector capacitance. A small collector capacitance can be achieved most readily by using a small active area for the transistor. It has therefore been extremely difficult in the past to obtain these two inconsistent objectives—good heat dissipation and low collector capacitance.

The transistors of this invention meet both of the above objectives without compromise. Although the active area of the transistor is split into subregions, the total active area is not appreciably increased. Therefore, the collector capacitance remains desirably small. The small collector capacitance combined with enhanced heat dissipation results in substantially improved high frequency operation.

In a preferred embodiment of the invention, the individual subareas of the device are interconnected by metallized leads over the surface of the semiconductor wafer. Preferably, this is carried out according to the teachings of U.S. Patent 2,981,877 issued to Dr. Robert N. Noyce and assigned to the same assignee as this invention. Specific patterns and plans of interconnection will be described in this specification which eliminate any possible uneven current distribution within the device due to the interconnection resistance. The details of these interconnections and the various embodiments of this invention will be more fully described with reference to the following drawings, in which:

The planar power transistor of this invention, capable of readily dissipating heat generated by current passing therethrough, is formed in a wafer 1 of monocrystalline semiconductor material, e.g., silicon, having a flat upper surface. The wafer of semiconductor material has certain regions formed within it. The first region is a collector region of one conductivity type, e.g. N-type, which is the body of wafer 1 itself. The proper doping can be achieved either by uniform crystal doping during growth, or subsequent doping, both as well known in the art.

Figure 1:
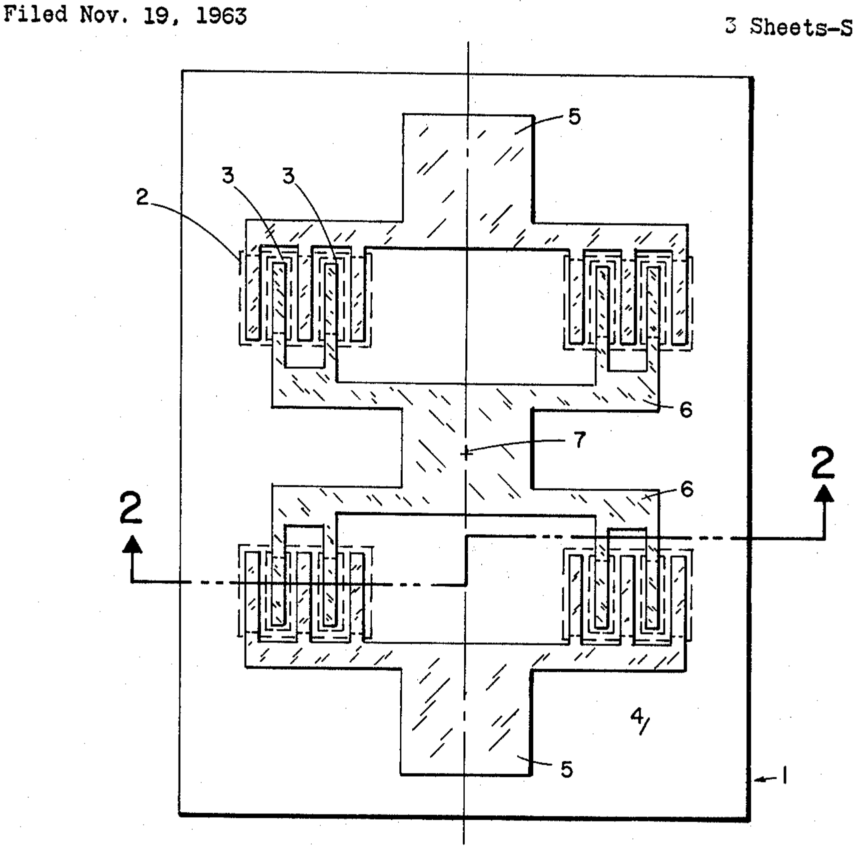
FIG. 1 is a somewhat schematic plan view of the planar power transistor of one embodiment of the invention.
Figure 2:
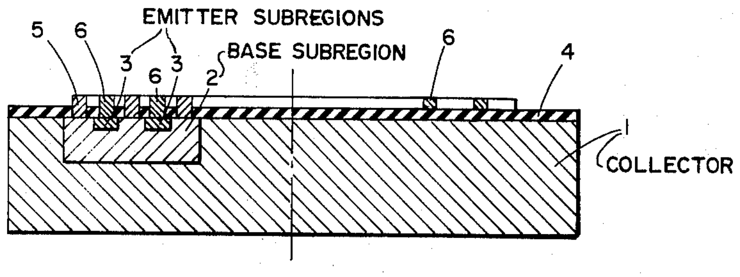
FIG. 2 is a somewhat schematic, cross-sectional view taken through the plane 2—2 of FIG. 1.

A plurality of base subregions 2 of the opposite conductivity type from the collector region, e.g. P-type, are formed within the collector region as shown in FIG. 2. These are formed by a diffusion step, generally, in the case of silicon, using the oxide of the semiconductor as a mask, as is well known in the art. The wafer is unmasked where the subregions 2 are to be formed. Each of these plurality of base subregions extends to the flat surface of wafer 1 and is separated laterally from the others, as shown in FIG. 1, by a distance at least equal to the thickness of wafer 1. This amount of separation insures an appreciable heat dissipation within the wafer.

The dopants used to form base subregions 2 may be any of the conventional semiconductor dopants chosen according to the desired base conductivity type. For example, for P-type base subregions, boron, aluminum, or indium are all capable of being masked by silicon oxide and thus may be used.

Next, a plurality of emitter subregions 3 of the same conductivity type as the collector are formed in the base subregions. At least one emitter subregion is formed within each of the base subregions and extends to the flat upper surface of wafer 1. In the case of an N-type wafer, these emitter subregions are implaced by the diffusion of N-type dopants through a mask. Preferably this mask is, in the case of silicon, silicon oxide. Conventional N-type dopants include phosphorus, arsenic, and antimony. The resulting diffused structure is shown in section in FIG. 2. In the embodiment of FIGS. 1 and 2, two emitter subregions 3 are formed in each base subregion 2. A single emitter subregion formed in each of the base subregions is sufficient to achieve the advantages of the invention.

At least part of the surface of the wafer is protected by an insulating coating 4, in the case of silicon, preferably silicon oxide. This oxide coating may be the same coating deposited for masking the diffusion steps outlined above. The oxide may be formed over the diffused, unmasked regions of wafer surface simultaneously with the diffusion, if the diffusion is carried out in an oxidizing atmosphere. Since the formation of silicon oxide coatings is well known in the art, no further explanation is considered necessary. In a subsequent conventional step, portions of the insulating coating are removed to provide areas of exposed semiconductor to which to make ohmic contact. The insulating coating remains over at least a part of the remainder of the surface, preferably at least covering the junctions which extend to the surface.

The power transistor of this invention is provided with means for ohmically collectively connecting the base subregions 2. Preferably, this means comprises metallized interconnections 5, shown in FIG. 1, deposited upon, and insulated from the semiconductor surface by insulating coating 4, except where these metallized interconnections make ohmic connections with the base subregions. FIG. 2 clearly shows how insulating coating 4 prevents contact of metallized interconnections 5 with regions and subregions of the transistor other than the base subregions 2.

The metallized interconnections themselves may be any metal capable of forming an ohmic contact to the semiconductor material. For example, aluminum may be used. The interconnections may be deposited through a mask to form the desired pattern shown in FIG. 1. Alternatively, however, the metal may be deposited over the entire surface of wafer 1 and then the unwanted portions etched away in a conventional manner to leave the pattern shown in FIG. 1. This latter method is fully explained in U.S. Patent 3,108,359 of Gordon E. Moore and Robert N. Noyce, assigned to the same assignee as this invention.

Means are provided for collectively connecting the emitter subregions. Preferably, these are also metallized interconnections deposited upon the insulating coating 4 except where they make ohmic connection with emitter subregions 3, in substantially the same manner as explained above for metallized base interconnections 5. If desired, all the metallized interconnections for both base and emitter subregions may be deposited in the same step. Metal is then deposited over the entire surface and the unwanted portions removed, as discussed above. As shown in FIG. 2, insulating coating 4 prevents contact of emitter metallized interconnections 6 with regions and subregions of the transistor other than the emitter subregions.

Preferably, as shown in FIG. 1, the metallized emitter subregion interconnections and the metallized base subregion interconnections are interdigitated with each other. This geometrical configuration insures good current transfer characteristics within the device, but is in no way critical to the invention. Many other configurations and geometries can be used. The emitter subregions are symmetrically arranged about a single point 7 on the transistor. Each of the emitter subregion interconnections runs from that point, so that the interconnection resistance between that point (usually the emitter connection point to the external circuitry) and each of the emitter subregions is approximately the same. When external connection to the emitter subregions of the transistor is made at point 7, there is substantially the same lead resistance in the leads to each of the emitter subregions. Therefore, the devices of FIGS. 1 and 2 will have balanced emitter current characteristics, with no appreciable differences in emitter current flow within various of the emitter subregions 3.

Figure 3:
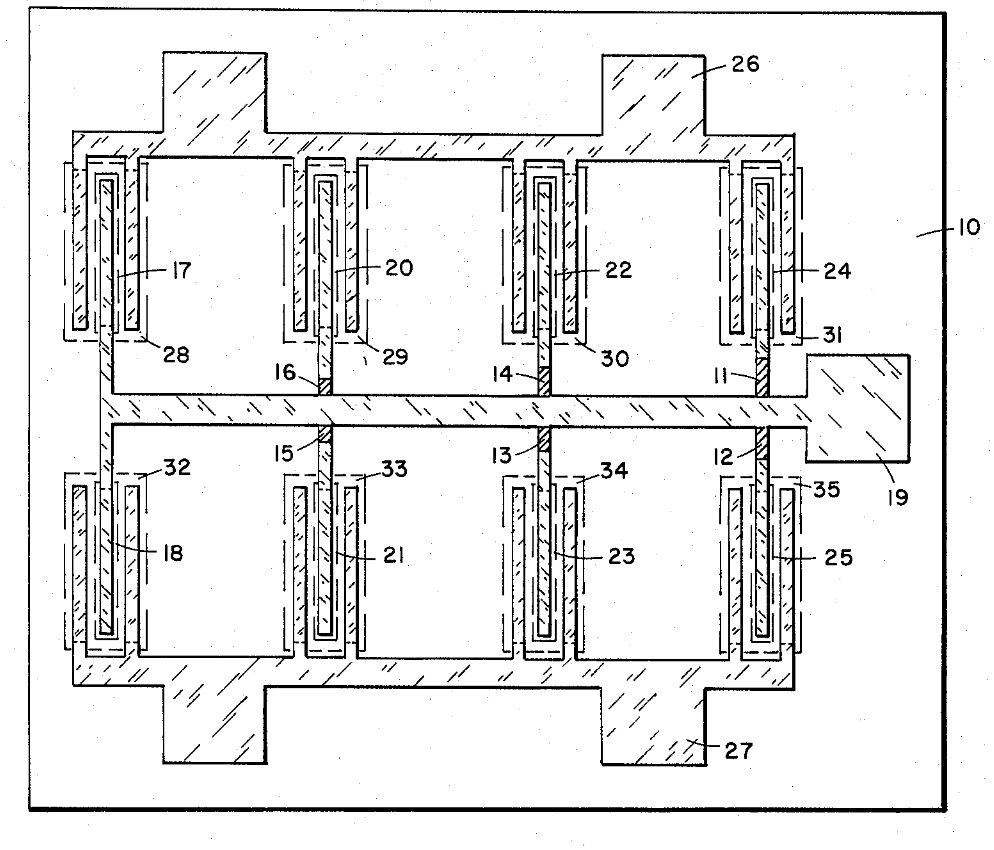
FIG. 3 is a somewhat schematic plan view of a planar power transistor of another embodiment of this invention.

Another embodiment of the invention is shown in plan view in FIG. 3. The formation of the base and emitter subregions in semiconductor wafer 10 is carried out as described above. Similarly, the metallizing for the emitter and base subregion interconnections may be deposited in the same step, if desired, as described above, leaving the pattern shown in FIG. 3. In this embodiment, metallizing is not deposited where resistors 11, 12, 13, 14, 15, and 16 are to be formed. Where metal is deposited over the entire surface, it is then etched away from these resistor areas at the same time as the metal is etched away from the other areas where metal is undesired. The purposes of resistors 11–16 will be described below.

It is observed in the plan view of FIG. 3 that certain of the emitter subregions, e.g., subregions 17 and 18, are located farther from one point (emitter contact point 19) on the transistor than the other emitter subregions 20, 21, 22, 23, 24, and 25. Analogously, emitter subregions 20 and 21 are located farther from emitter contact point 19 than subregions 22, 23, 24, and 25. Subregions 22 and 23 are farther away from point 19 than subregions 24 and 25. It is apparent that the interconnection resistance between emitter contact point 19 and emitter subregions 17 and 18, for example, is greater than the interconnection resistance between point 19 and emitter subregions 20–25. To compensate for such differences in interconnection resistances to various subregions, resistors 11, 12, 13, 14, 15, and 16 are deposited on the surface of the wafer as shown in FIG. 3. These resistors are preferably included within the emitter subregion metallized interconnections 19, as shown. The resistors are in series with emitter subregion interconnections making contact with each of emitter subregions 20–25 (the ones located closer to point 19 than the farthest-separated emitter subregions 17 and 18). The resistance value of these deposited resistors is not the same for all subregions. The particular resistances are selected in order to approximately equate the total interconnection resistance between point 19 and each of the emitter subregions 17, 18, 20, 21, 22, 23, 24, and 25, in spite of differences between the proximity of such subregions to point 19. Thus, the device shown in FIG. 3 provides approximately equal lead resistance to each of the emitter subregions. Again, this balanced interconnection resistance provides equal current to each of the emitter subregions, so that no excessive heating occurs in any one of them because of excessive current loads.

Base interconnections 26 and 27 shown in FIG. 3 are formed as described above, preferably at the same time as the emitter interconnections. These make contact with base subregions 28, 29, 30, 31, 32, 33, 34, and 35, as shown.

Figure 4:
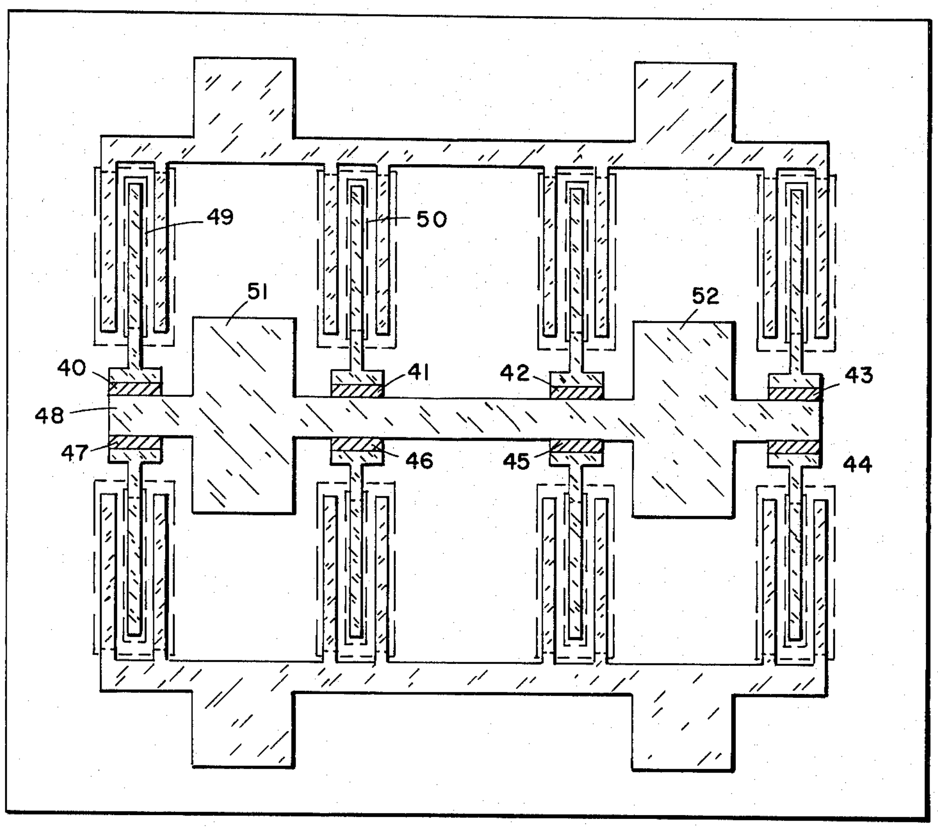
FIG. 4 is a somewhat schematic plan view of a planar power transistor of still another embodiment of this invention.

Another embodiment of the invention is shown in FIG. 4. Again, the formation of the emitter and base subregions within the wafer and the deposition of the metallized interconnections is substantially the same as described above for previous embodiments. In this embodiment, however, each of the metallized interconnections to the emitter subregions includes deposited series resistors 40, 41, 42, 43, 44, 45, 46, and 47. These resistors have approximately equal resistance values, substantially greater than the value of the resistance of the metallized emitter subregion interconnections 48. Therefore, any differences in the resistance values of the metallized emitter subregion interconnections from contact points 51 or 52 to one emitter subregion, e.g., subregion 49, and 59 another emitter subregion, e.g., subregion 50, are negligible in comparison to the total interconnection resistance which includes the resistance of the deposited series resistors 40–47. Again, this embodiment provides approximately equal resistance between emitter contact points 51 and 52 and each of the emitter subregions because variances in metallization resistances are overshadowed by the resistances of the equal resistors 40–47. Therefore, an even current distribution throughout the emitter subregions of the transistor is maintained, as desired.

Still another way of maintaining approximately equal resistance between emitter subregion contact points 51 and 52, shown in FIG. 4, and each of the emitter subregions is to minimize the resistance of the metallized interconnections. Instead of using series resistors 40–47 of equal value to overshadow resistance variations, the metallized emitter subregion interconnections may be fabricated of very low resistivity material. Preferably, the resistance of these interconnections is so low that a change in interconnection resistance with a substantial change in interconnection length is negligible. Therefore, differences in the resistance of the various emitter subregion interconnections is also negligible. Low resistance interconnections may be obtained by using a relatively thick layer of deposited metal, e.g., at least about 3 microns. These interconnections may be fabricated from aluminum, for example, or preferably from a layer of deposited aluminum at least about 0.3 micron thick, covered by a second layer of deposited silver, at least about 1 micron thick.

While various preferred embodiments of this invention have been described above and shown in the drawings, the invention is obviously not limited to these specific configurations. It will be obvious to one skilled in the art that many other configurations using the principles taught herein may be easily fabricated. Therefore, the only limitations to be placed upon the scope of this invention are those clearly expressed in the claims which follow.

What is claimed is:

1. A planar power transistor capable of readily dissipating heat generated by current passing therethrough, comprising:

a monocrystalline wafer of semiconductor material having a flat surface, and having formed therein;
 a collector region of one conductivity type,
 a plurality of base subregions of the opposite conductivity type from said collector region formed within said collector region and extending to said flat surface, each of said base subregions being separated laterally from the others by a distance at least equal to the thickness of said wafer, thereby reducing the thermal coupling between said subregions,
 a plurality of emitter subregions of said one conductivity type, at least one formed within each of said base subregions and extending to said flat surface;
an insulating coating on at least part of said surface;
means ohmically collectively connecting said base subregions, said means comprising metallized interconnections deposited upon said insulating coating except where they make ohmic connection with said base subregions, said coating preventing contact of said metallized interconnections with the regions and subregions of said transistor other than said base subregions; and
means ohmically collectively connecting said emitter subregions, said means comprising metallized interconnections deposited upon said insulating coating except where they make ohmic connection with said emitter subregions, said coating preventing contact with the regions and subregions of said transistor other than said emitter subregions.

2. A planar power transistor capable of readily dissipating heat generated by current passing therethrough, comprising:

a monocrystalline wafer of semiconductor material having a flat surface, and having formed therein;
 a collector region of one conductivity type,
 a plurality of base subregions of the opposite conductivity type from said collector region formed within said collector region and extending to said flat surface, each of said base subregions being separated laterally from the others by a distance at least equal to the thickness of said wafer,
 a plurality of emitter subregions of said one conductivity type, at least one formed within each of said base subregions and extending to said flat surface;
an insulating coating on at least part of said surface;
means ohmically collectively connecting said base subregions, said means comprising metallized interconnections deposited upon said insulating coating except where they make ohmic connection with said base subregions, said coating preventing contact of said metallized interconnections with the regions and subregions of said transistor other than said base subregions; and
means ohmically collectively connecting said emitter subregions, said means comprising metallized interconnections deposited upon said insulating coating except where they make ohmic connection with said emitter subregions, said coating preventing contact with the regions and subregions of said transistor other than said emitter subregions, said metallized emitter subregion interconnections being interdigitated with said metallized base subregion interconnection.

3. A planar power transistor capable of readily dissipating heat generated by current passing therethrough, comprising:

a monocrystalline wafer of semiconductor material having a flat surface, and having formed therein;
 a collector region of one conductivity type,
 a plurality of base subregions of the opposite conductivity type from said collector region formed within said collector region and extending to said flat surface, each of said base subregions being separated laterally from the others by a distance at least equal to the thickness of said wafer,
 a plurality of emitter subregions of said one conductivity type, at least one formed within each of said base subregions and extending to said flat surface;
an insulating coating of silicon oxide on at least part of said surface;
means ohmically collectively connecting said base subregions, said means comprising metallized interconnections deposited upon said insulating coating except where they make ohmic connection with said base subregions, said coating preventing contact of said metallized interconnections with the regions and subregions of said transistor other than said base subregions; and
means ohmically collectively connecting said emitter subregions, said means comprising metallized interconnections deposited upon said insulating coating except where they make ohmic connection with said emitter subregions, said coating preventing contact with the regions and subregions of said transistor other than said emitter subregions, said emitter subregions being symmetrically arranged about a single point on said transistor, and each of said emitter subregion interconnections running from said point, so that the interconnection resistance between said point and each of said emitter subregions is approximately the same.

4. A planar power transistor capable of readily dissipating heat generated by current passing therethrough, comprising:

a monocrystalline wafer of semiconductor material having a flat surface, and having formed therein;
 a collector region of one conductivity type,
 a plurality of base subregions of the opposite conductivity type from said collector region formed within said collector region and extending to said flat surface, each of said base subregions being separated laterally from the others by a distance at least equal to the thickness of said wafer,
 a plurality of emitter subregions of said one conductivity type, at least one formed within each of said base subregions and extending to said flat surface;
an insulating coating on at least part of said surface;
means ohmically collectively connecting said base subregions, said means comprising metallized interconnections deposited upon said insulating coating except where they make ohmic connection with said base subregions, said coating preventing contact of said metallized interconnections with the other regions and subregions of said transistor other than said base subregions, certain of said emitter subregions being located farther from a point on said transistor than others of said emitter subregions; and means ohmically collectively connecting said emitter subregions, said means comprising metallized interconnections deposited upon said insulating coating except where they make ohmic connection with said emitter subregions, said coating preventing contact between said interconnections and the regions and subregions of said transistor other than said emitter subregions, said metallized interconnections including deposited resistors in series with those interconnections making ohmic connection with emitter subregions located closer to said point than the farthest-separated emitter subregion, the resistance value of said resistors in each interconnection being selected to approximately equate the total interconnection resistance between said point and each of said emitter subregions in spite of differences between the proximity of various of such subregions to said point.

5. A planar power transistor capable of readily dissipating heat generated by current passing therethrough, comprising:

a monocrystalline wafer of semiconductor material having a flat surface, and having formed therein;

a collector region of one conductivity type, a plurality of base subregions of the opposite conductivity type from said collector region formed within said collector region and extending to said flat surface, each of said base subregions being separated laterally from the others by a distance at least equal to the thickness of said wafer, a plurality of emitter subregions of said one conductivity type, at least one formed within each of said base subregions and extending to said flat surface;

an insulating coating of silicon oxide on at least part of said surface;

means ohmically collectively connecting said base subregions, said means comprising metallized interconnections deposited upon said insulating coating except where they make ohmic connection with said base subregions, said coating preventing contact of said metalized interconnections with the other regions and subregions of said transistor other than said base subregions, certain of said emitter subregions being located farther from a point on said transistor than others of said emitter subregions; and means ohmically collectively connecting said emitter subregions, said means comprising metallized interconnections deposited upon said insulating coating except where they make ohmic connection with said emitter subregions, said coating preventing contact between said interconnections and the regions and subregions of said transistor other than said emitter subregions, said metallized interconnections including deposited resistors in series with those interconnections making ohmic connection with emitter subregions located closer to said point than the farthest-separated emitter subregion, the resistance value of said resistors in each interconnection being selected to approximately equate the total interconnection resistance between said point and each of said emitter subregions in spite of differences between the proximity of various of such subregions to said point.

6. A planar power transistor capable of readily dissipating heat generated by current passing therethrough, comprising:

a monocrystalline wafer of semiconductor material having a flat surface, and having formed therein;

a collector region of one conductivity type, a plurality of base subregions of the opposite conductivity type from said collector region formed within said collector region and extending to said flat surface, each of said base subregions being separated laterally from the others by a distance at least equal to the thickness of said wafer, a plurality of emitter subregions of said one conductivity type, at least one formed within each of said base subregions and extending to said flat surface;

an insulating coating on at least part of said surface;

means ohmically collectively connecting said base subregions, said means comprising metallized interconnections deposited upon said insulating coating except where they make ohmic connection with said base subregions, said coating preventing contact of said metallized interconnections with the other regions and subregions of said transistor other than said base subregions; and means ohmically collectively connecting said emitter subregions, said means comprising metallized interconnections deposited upon said insulating coating except where they make ohmic connection with said emitter subregions, said coating preventing contact between said interconnections and the regions and subregions of said transistor other than said emitter subregions, each of said metallized interconnections to said emitter subregions including deposited series resistors of equal resistance value substantially greater than the value of the resistance of the metallized emitter subregion interconnections, so that any differences in said resistance value of said metallized interconnections between one emitter subregion interconnection and another are negligible in comparison to the total interconnection resistance including the resistance of said deposited series resistor.

7. A planar power transistor capable of readily dissipating heat generated by current passing therethrough, comprising:

a monocrystalline wafer of semiconductor material having a flat surface, and having formed therein;

a collector region of one conductivity type, a plurality of base subregions of the opposite conductivity type from said collector region formed within said collector region and extending to said flat surface, each of said base subregions being separated laterally from the others by a distance at least equal to the thickness of said wafer, a plurality of emitter subregions of said one conductivity type, at least one formed within each of said base subregions and extending to said flat surface;

an insulating coating of silicon oxide on at least part of said surface;

means ohmically collectively connecting said base subregions, said means comprising metallized interconnections deposited upon said insulating coating except where they make ohmic connection with said base subregions, said coating preventing contact of said metallized interconnections with the other regions and subregions of said transistor other than said base subregions; and means ohmically collectively connecting said emitter subregions, said means comprising metallized interconnections deposited upon said insulating coating except where they make ohmic connection with said emitter subregions, said coating preventing contact between said interconnections and the regions and subregions of said transistor other than said emitter subregions, each of said metallized interconnections to said emitter subregions including deposited series resistors of equal resistance value substantially greater than the value of the resistance of the metallized emitter subregion interconnections, so that any differences in said resistance value of said metallized interconnections between one emitter subregion interconnection and another are negligible in comparison to the total interconnection resistance including the resistance of said deposited series resistor.

References Cited by the Examiner

UNITED STATES PATENTS 2,981,877 4/1961 Noyce ------------ 317—101 X
3,158,788 11/1964 Last --------------- 317—101

KATHLEEN H. CLAFFY, *Primary Examiner.*
JOSEPH J. BOSCO, *Assistant Examiner.*